United States Patent
Fukuoka et al.

(10) Patent No.: US 10,825,611 B1
(45) Date of Patent: Nov. 3, 2020

(54) MULTILAYER ELECTRONIC COMPONENT AND MOUNTING STRUCTURE THEREOF

(71) Applicant: TDK CORPORATION, Tokyo (JP)

(72) Inventors: Tomohisa Fukuoka, Tokyo (JP); Tetsuhiro Takahashi, Tokyo (JP); Akinori Ohi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/930,668

(22) Filed: Jul. 16, 2020

(30) Foreign Application Priority Data

Jul. 17, 2019 (JP) .................. 2019-132009

(51) Int. Cl.
| | |
|---|---|
| *H01G 4/00* | (2006.01) |
| *H01G 4/30* | (2006.01) |
| *H01G 4/248* | (2006.01) |
| *H01G 4/012* | (2006.01) |
| *H05K 1/18* | (2006.01) |
| *H05K 1/11* | (2006.01) |
| *H01G 4/12* | (2006.01) |

(52) U.S. Cl.
CPC .............. *H01G 4/30* (2013.01); *H01G 4/012* (2013.01); *H01G 4/12* (2013.01); *H01G 4/248* (2013.01); *H05K 1/11* (2013.01); *H05K 1/181* (2013.01); *H05K 2201/10015* (2013.01)

(58) Field of Classification Search
CPC .......... H01G 4/00; H01G 4/002; H01G 4/005; H01G 4/008; H01G 4/12; H01G 4/248; H05K 1/181
See application file for complete search history.

(56) References Cited

U.S. PATENT DOCUMENTS

| | | | | |
|---|---|---|---|---|
| 2009/0002920 A1* | 1/2009 | Itamura | ................ | H01G 4/2325 361/321.3 |
| 2012/0188684 A1* | 7/2012 | Akazawa | ............... | H01G 4/005 361/321.2 |
| 2013/0050896 A1* | 2/2013 | Park | ......................... | H01G 4/30 361/321.1 |
| 2013/0208401 A1* | 8/2013 | Shirakawa | ............. | H01G 4/008 361/305 |
| 2015/0001998 A1 | 1/2015 | Katsuta et al. | | |

(Continued)

FOREIGN PATENT DOCUMENTS

JP         2015-029050 A    2/2015

*Primary Examiner* — Hoa C Nguyen
(74) *Attorney, Agent, or Firm* — Oliff PLC

(57) ABSTRACT

To improve a mounting reliability while maintaining a thickness of the external electrode at a side face of a multilayer electronic component thin. The multilayer electronic component includes ceramic body in which ceramic layers and an external electrode formed to an end face of the ceramic body. The upper electrode layer includes an element having higher standard electrode potential than Cu. The external electrode includes an external electrode end part and an external electrode extension part which is integrally formed with the external electrode end part. $1.20 \leq t2/t1 \leq 4.50$ is satisfied in which t1 is a total thickness of a thickness of the intermediate electrode layer thickness and t2 is a length from an end of the base electrode layer to an end of the upper electrode layer along the first axis of the external electrode extension part connected by the conductive adhesive.

10 Claims, 4 Drawing Sheets

(56) References Cited

U.S. PATENT DOCUMENTS

| | | | |
|---|---|---|---|
| 2015/0287532 A1* | 10/2015 | Abe | H01G 4/2325 |
| | | | 174/260 |
| 2016/0141103 A1* | 5/2016 | Hamanaka | H01G 4/232 |
| | | | 361/301.4 |
| 2016/0268046 A1* | 9/2016 | Nishisaka | H01G 4/12 |
| 2016/0276106 A1* | 9/2016 | Kuroiwa | H01G 4/30 |
| 2017/0222117 A1 | 8/2017 | Katsuta et al. | |
| 2018/0068788 A1* | 3/2018 | Kobayashi | H01F 27/292 |
| 2018/0294099 A1* | 10/2018 | Makino | H01G 4/2325 |
| 2019/0103225 A1* | 4/2019 | Han | H01G 4/12 |
| 2019/0326058 A1* | 10/2019 | Lee | H01G 4/248 |
| 2020/0105472 A1* | 4/2020 | Song | H01G 4/236 |

\* cited by examiner

MULTILAYER ELECTRONIC COMPONENT AND MOUNTING STRUCTURE THEREOF

TECHNICAL FIELD

The present invention relates to a multilayer electronic component and a mounting structure thereof.

BACKGROUND

Regarding an external electrode of a multilayer ceramic electronic component, Patent Document 1 discloses technology of controlling a thickness of a side face of an intermediate electrode layer made of Ni plating by using Pd plating or Pd—Ni alloy to an upper electrode layer. Further, Patent Document 1 discloses that the multilayer ceramic electronic component can be mounted using a conductive adhesive.
[Patent Document 1] JP Patent Application Laid Open No. 2015-29050

SUMMARY

Recently, an electronic component is demanded to attain a lower height and an improved of mounting reliability. The object of the present invention is to reduce thickness of an external electrode at a side face of the multilayer electronic component and also to improve a mounting reliability.

Keen examination was carried out to attain the above-mentioned object and to obtain the present invention.

The multilayer electronic component of the present invention includes a ceramic body in which internal electrode layers and ceramic layers substantially parallel to a plane including a first axis and a second axis are stacked in alternating manner along a third axis, and an external electrode formed on an end face of the first axis of the ceramic body; wherein the external electrode has a base electrode layer formed directly on the end face of the ceramic body so to electrically connect with at least part of the internal electrode layers, an intermediate electrode layer formed on an outer surface of the base electrode layer, and an upper electrode layer formed on an outer surface of the intermediate electrode layer;

the base electrode layer includes Cu;

the intermediate electrode layer includes Ni;

the upper electrode layer includes an element having higher standard electrode potential than Cu;

the external electrode includes an external electrode end part covering the end face of the ceramic body in the first axis and an external electrode extension part integrally formed with the external electrode end part and covering side faces of the ceramic body facing across the second axis and also covering side faces of the ceramic body facing across the third axis; and $1.20 \leq t2/t1 \leq 4.50$ is satisfied in which t1 is a total thickness of a thickness of the intermediate electrode layer and a thickness of the upper electrode layer at an external electrode maximum thickness part having a maximum thickness of the external electrode in the external electrode extension part and t2 is a length from an end of the base electrode layer to an end of the upper electrode layer along the first axis of the external electrode extension part.

By satisfying the above-mentioned constitution, the multilayer electronic component of the present invention reduces the thickness of the external electrode along the second axis or along the third axis; and also, a crack is suppressed form forming thus a mounting reliability can be improved.

The multilayer electronic component of the present invention may satisfy $3° \leq \theta \leq 30°$ when $(0.5 \times t3)/t4 = \tan \theta$ in which t3 is a thickness of the base electrode layer in the external electrode maximum thickness part and t4 is a length from an end of the base electrode layer to a part where the thickness of the base electrode layer is $0.5 \times t3$ along the first axis of the base electrode layer.

The multilayer electronic component of the present invention may satisfy $0.003 \leq t5/t1 \leq 0.130$ in which t5 is a thickness of the upper electrode layer of the external electrode maximum thickness part.

The multilayer electronic component of the present invention may include glass phases existing in the external electrode extension part at a cross section of the external electrode including the first axis and the third axis, and satisfying $1.40 \leq t1/S_{ave} \leq 4.00$ in which $S_{ave}$ is an average length of the glass phases included in the external electrode extension part at a boundary between the base electrode layer and the intermediate electrode layer.

The multilayer electronic component of the present invention may include the upper electrode layer including one or more elements selected from Au and Pd as the element having a higher standard electrode potential than Cu.

A mounting structure of the multilayer electronic component of the present invention includes the multilayer electronic component and a mounting substrate to which the multilayer electronic component is fixed; wherein the multilayer electronic component has a ceramic body in which internal electrode layers and ceramic layers substantially parallel to a plane including a first axis and a second axis are stacked in alternating manner along a third axis, and an external electrode formed on an end face of the first axis of the ceramic body;

the external electrode has a base electrode layer formed directly on the end face of the ceramic body so to electrically connect with at least part of the internal electrode, an intermediate electrode layer formed on an outer surface of the base electrode layer, and an upper electrode layer formed on an outer surface of the intermediate electrode layer;

the base electrode layer includes Cu;

the intermediate electrode layer includes Ni;

the upper electrode layer includes an element having higher standard electrode potential than Cu;

the external electrode includes an external electrode end part covering the end face of the ceramic body in the first axis and an external electrode extension part integrally formed with the external electrode part and covering side faces of the ceramic body facing across the second axis and also covering side faces of the ceramic body facing across the third axis;

the mounting substrate includes a land as a part of a pair of lands which is capable of electrically connecting to the external electrode;

the external electrode extension part and the land are bonded using a conductive adhesive; and $1.20 \leq t2/t1 \leq 4.50$ is satisfied in which t1 is a total thickness of a thickness of the intermediate electrode layer thickness and a thickness of the upper electrode layer at an external electrode maximum thickness part having a maximum thickness of the external electrode in the external electrode extension part and t2 is a length from an end of the base electrode layer to an end of the upper electrode layer along the first axis of the external electrode extension part connected by the conductive adhesive.

The mounting structure of the multilayer electronic component of the present invention may satisfy $3°≤θ≤30°$ when $(0.5×t3)/t4=\tan θ$ in which t3 is a thickness of the base electrode layer in the external electrode maximum thickness part and t4 is a length from an end of the base electrode layer to a part where the thickness of the base electrode layer is $0.5×t3$ along the first axis of the base electrode layer.

The mounting structure of the multilayer electronic component of the present invention may satisfy $0.003≤t5/t1≤0.130$ in which t5 is a thickness of the upper electrode layer of the external electrode maximum thickness part.

The mounting structure of the multilayer electronic component of the present invention may include glass phases existing in the external electrode extension part at a cross section of the external electrode including the first axis and the third axis, and may satisfy $1.40≤t1/S_{ave}≤4.00$ in which $S_{ave}$ is an average length of the glass phases included in the external electrode extension part at a boundary between the base electrode layer and the intermediate electrode layer.

The mounting structure of the multilayer electronic component of the present invention may include the upper electrode layer which includes one or more elements selected from Au and Pd as the element having a higher standard electrode potential than Cu.

DETAILED DESCRIPTION

A multilayer ceramic capacitor and a mounting structure thereof according to one embodiment of the present invention are described based on figures. Note that, a multilayer electronic component of the present invention is not limited to the multilayer ceramic capacitor, and a mounting structure of the multilayer electronic component is not limited to the mounting structure of the multilayer ceramic capacitor.

Figure 1:
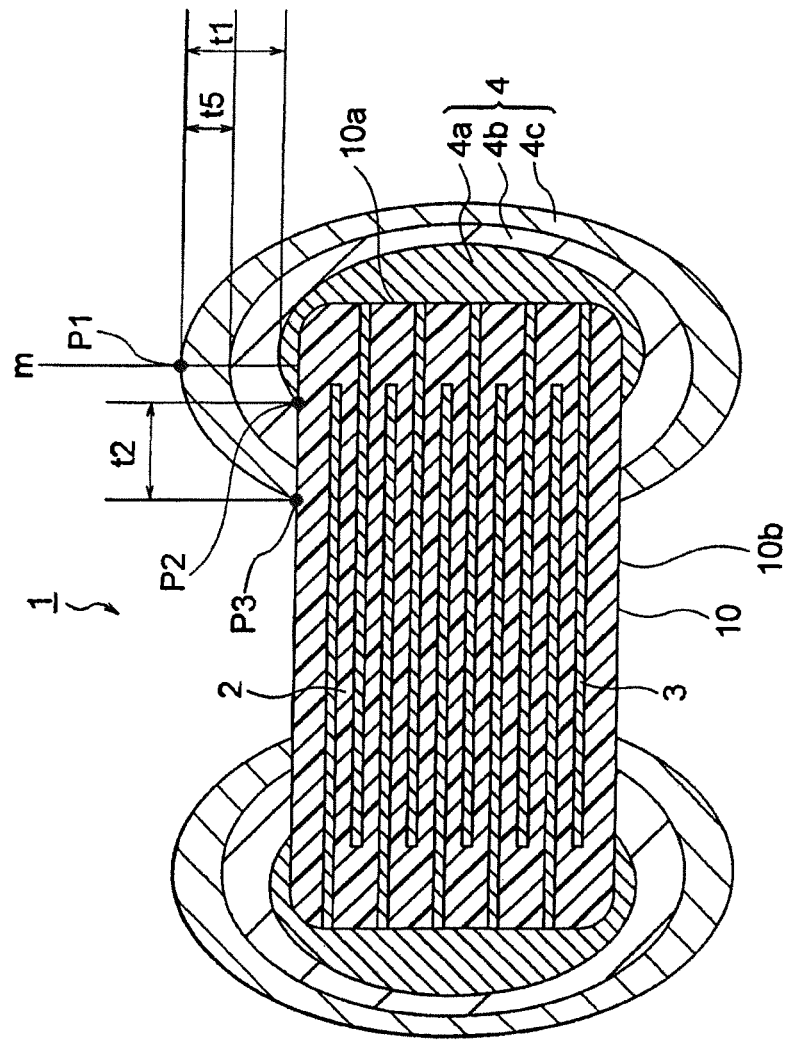
FIG. 1 shows a schematic cross section of a multilayer ceramic capacitor.

As shown in FIG. 1, a multilayer ceramic capacitor 1 according to the present embodiment includes internal electrode layers 3 and ceramic layers 2 substantially parallel to a plane including X axis and Y axis, and a ceramic body 10 in which the ceramic layers 2 and the internal electrode layers 3 are stacked in alternating manner along Z axis.

Here, "substantially parallel" means that most parts of the ceramic layers and the internal electrode layers are parallel to the plane including X axis and Y axis, and it also means that there may be part which are not necessarily parallel. That is, the ceramic layers 2 and the internal electrode layers 3 may have some roughness or may be slanted.

A shape of the ceramic body 10 is not particularly limited. In case the ceramic body 10 is a rectangular parallelepiped shape, a length along X axis may be 3.2 mm or less and 0.6 mm or more. A length along Y axis and a length along Z axis may be 1.6 mm or less and 0.3 mm or more.

The internal electrode layers 3 are stacked so that each end exposes alternatingly to a surface of end faces 10a facing against each other of the ceramic body 10. A pair of external electrodes 4 is formed to both end faces 10a of the ceramic body 10 and connects with exposed ends of the internal electrode layers 3 placed alternatingly. Thereby, a capacitor circuit is formed.

A thickness of a ceramic layer 2 is not particularly limited. It may be 100 μm or less per each layer, and it may be 30 μm or less per each layer. Also, it may be 0.5 μm or more per each layer.

A number of stacked ceramic layers 2 is not particularly limited. It may be 20 or more and 50 or more.

A material of the ceramic layer 2 is not particularly limited. For example, dielectric ceramics including $BaTiO_3$, $CaTiO_3$, $SrTiO_3$, $CaZrO_3$, $BaZrO_3$, $SrZrO_3$, $(K_{1-x}Na_x)Sr_2Nb_5O_{15}$, $Ba_3TiNb_4O_{15}$, and the like as a main component can be used. Also, dielectric ceramics added with a sub component such as Mn compound, Mg compound, Cr compound, Ni compound, a compound of rare earth element, Si compound, Li compound, and the like to the above-mentioned main component may be used. An added amount of the sub component is not particularly limited. For example, it may be 70 mass % or less relative to 100 mass % of the dielectric ceramics.

As the material of the ceramic layer 2, other than mentioned in above, ceramics for example, piezoelectric ceramics such as PZT based ceramics; semiconductor ceramics such as spinel based ceramic; magnetic ceramics such as ferrite, and the like may be used.

The material of an internal electrode layer 3 is not particularly limited. As a conductive material of the internal electrode layer 3, Ni, Ni based alloy, Cu, or Cu based alloy may be used.

As the conductive material of the internal electrode layer 3, Ni or Ni based alloy is preferably used. The internal electrode layer 3 using Ni or Ni based alloy as the conductive material may further include one or more sub components selected from Al, Si, Li, Cr, and Fe.

By including one or more sub components selected from Al, Si, Li, Cr, and Fe to the internal electrode layer 3 including Ni or Ni based alloy, the sub components of the internal electrode layer reacts with oxygen before Ni reacts with oxygen in air and forms NiO, thereby an oxide film made of oxides of sub components is formed on the surface of Ni. That is, oxygen in air needs to pass through the oxide film to react with Ni. Therefore, Ni in the internal electrode layer 3 becomes difficult to be oxidized. As a result, a deterioration of continuity caused by oxidation of the internal electrode layer including Ni is suppressed and a deterioration of conductivity is also suppressed.

Figure 2:
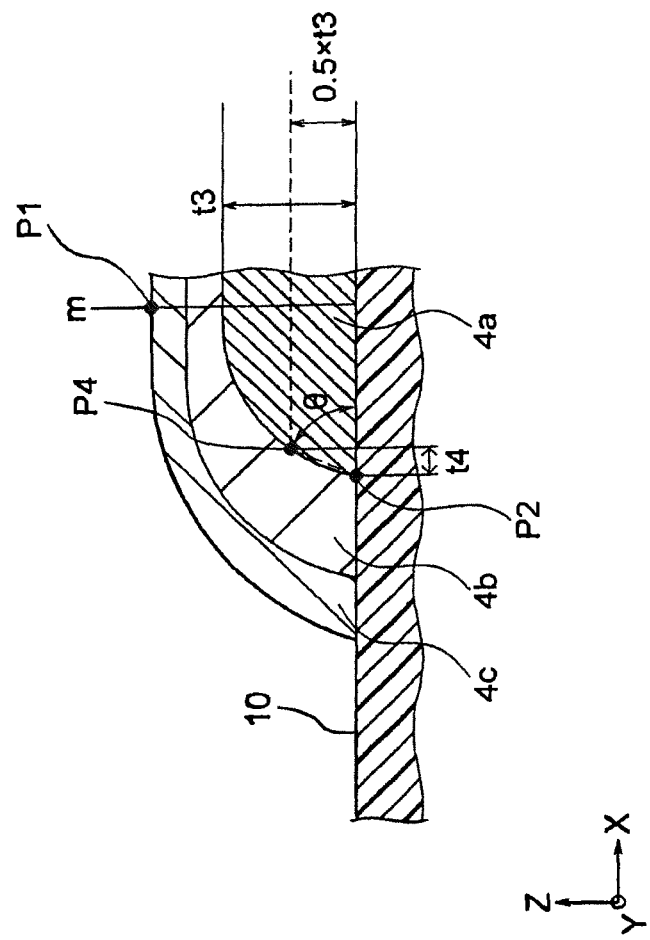
FIG. 2 shows a schematic cross section around an external electrode of the multilayer ceramic capacitor.
Figure 3:
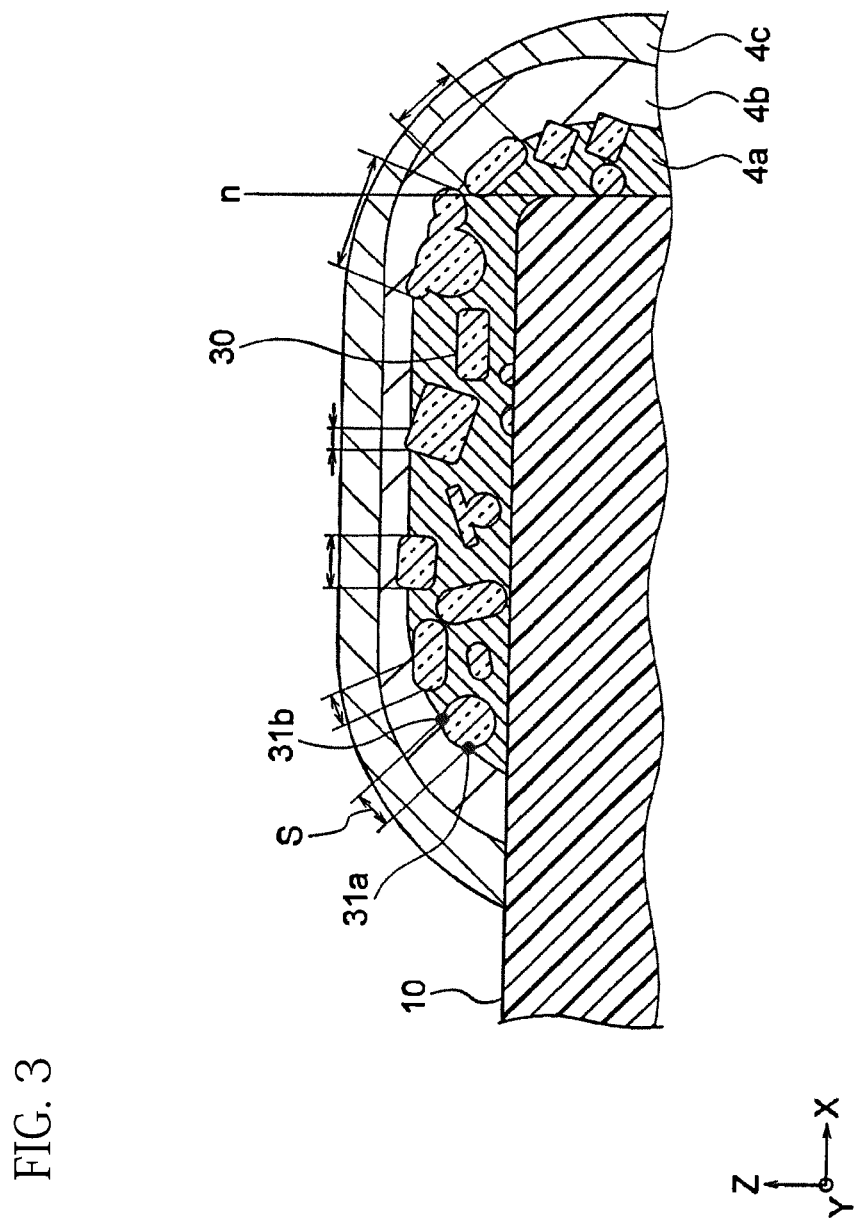
FIG. 3 shows a schematic cross section around an external electrode of the multilayer ceramic capacitor.

As shown in FIG. 2 and FIG. 3, in the present embodiment, external electrodes 4 include external electrode end parts formed at a pair of end faces 10a facing against each other of the ceramic element 10 in X axis, and external electrode extension parts integrally formed with the external electrode end parts and covering side faces 10b of the ceramic body 10 facing across Y axis and also covering side faces of the ceramic body 10 facing across Z axis. The external electrode extension parts does not necessarily have to be formed to all of the side faces 10b, but it may be formed to at least one side face 10b. Note that, a straight line shown in FIG. 3 is a boundary between the external electrode end part and the external electrode extension part at one of the external electrodes.

FIG. 2 shows a part including the external electrode end part and the external electrode extension part of one external electrode, and a part including the external electrode end part and the external electrode extension part of other external electrode may have the same constitution.

Each of the external electrodes 4 of the present invention includes a base electrode layer 4a formed directly on an end face 10a of the ceramic body 10 so to electrically connect with at least part of the internal electrode 3, at least one layer of an intermediate electrode layer 4b formed on an outer surface of the base electrode layer 4a, and an upper electrode layer 4c formed on an outer surface of the intermediate electrode layer 4b.

Note that, the base electrode layer 4a may not necessarily have to be directly formed to the side face 10b of the ceramic body 10. For example, a protective coating such as a glass coating and the like may be formed to the side face of the ceramic body 10 and then the base electrode layer 4a may be formed on the protective coating. In such case, an adhesiveness of the external electrodes 4 tends to easily improve.

The base electrode layer 4a at least includes Cu. Further, the base electrode layer 4a may include glass. As metals other than Cu included in the base electrode layer 4a, for example Ni, Pd, and the like may be mentioned. A type of glass is not particularly limited. For example, glass including at least one selected from ZnO, $SiO_2$, $TiO_2$, and $B_2O_3$ may be mentioned. Also, a content of Cu in the base electrode layer 4a is not particularly limited. For example, it may be 65 mass % or more relative to 100 mass % of the base electrode layer 4a.

The intermediate electrode layer 4b may be a single layer or it may be constituted from two or more layers. At least one layer of the intermediate electrode layer 4b includes Ni. The layer including Ni is preferably a Ni plating layer formed by Ni plating. The layer including Ni may include elements such as P, B, and the like. A content of Ni in the layer including Ni is not particularly limited. For example, it may be 85 mass % or more relative to 100 mass % of the layer including Ni.

Also, when the intermediate electrode layer 4b includes Ni plating layer, the base electrode layer 4a having relatively poor plating such as a rough surface part, a glass segregation part, and the like can be covered by the Ni plating layer. Further, the surface of the intermediate electrode layer 4b can be smoother than the surface of the base electrode layer 4a. As a result, smoothness and adhesiveness of the upper electrode layer 4c can be enhanced. Further, when the upper electrode layer 4c is formed by plating, even when the external electrode 4 is immersed in a plating solution, metals included in the base electrode layer 4a can be suppressed from dissolving into the plating solution.

When the intermediate electrode layer 4b is constituted by two or more layers, a material of layers other than the layer including Ni is not particularly limited. For example, it may be a layer including Pd, a layer including Pt, and the like.

The upper electrode layer 4c includes an element having higher standard electrode potential than Cu. Thereby, particularly in case of mounting on the mounting substrate using a conductive adhesive including Ag as a conductive filler, a galvanic corrosion of the external electrode 4 can be suppressed. As a result, the mounting reliability of the ceramic capacitor 1 is improved. Relative to 100 mass % of the upper electrode layer 4c, a content ratio of the element having higher standard electrode potential than Cu may be 70 mass % or more in total. The element having higher standard electrode potential than Cu may be one or more elements selected from Au and Pd. The upper electrode layer 4c may for example be a Pd plating layer, an Au plating layer, an Au—Pd—Ni alloy layer, or an Au—Pd alloy layer. Note that, in case the element having higher standard electrode potential than Cu is not included, the external electrode 4, a galvanic corrosion tends to easily occur particularly to the upper electrode layer 4c.

A part having a maximum thickness of the external electrode 4 in the external electrode extension part of the external electrode 4 of the multilayer ceramic capacitor 1 according to the present embodiment, that is a part shown by a straight line m parallel to Z axis and passing through point P1 in FIG. 1 is defined as an external electrode maximum thickness part. Further, t1 is a total thickness of a thickness of the upper electrode layer 4c and a thickness of the intermediate electrode layer 4b at the external electrode maximum thickness part. Also, t2 is a length from an end (P2) of the base electrode layer 4a to an end (P3) of the upper electrode layer 4c along X axis of the external electrode extension part.

The multilayer ceramic capacitor 1 according to the present embodiment satisfies $1.20 \leq t2/t1 \leq 4.50$.

By satisfying $1.20 \leq t2/t1 \leq 4.50$, the multilayer ceramic capacitor 1 according to the present embodiment can suppress a copper damage caused between the conductive adhesive and the external electrode 4 during mounting. Since the copper damage can be suppressed, the mounting reliability can be improved while making the size in Y axis and/or Z axis more compact.

A boundary between the external electrode 4 and the ceramic body 10 has a low adhesiveness. As a result, copper ion diffuses to the conductive adhesive from the base electrode layer 4a, and a resin component included in the conductive adhesive deteriorates due to the copper ion. Then, strength of the conductive adhesive deteriorates, and an adhesive strength between the external electrode and the conductive adhesive decreases. This is the copper damage. Particularly, by thickening the thickness of the intermediate electrode layer 4b and the thickness of the upper electrode layer 4c around the end of the external electrode extension part, the base electrode layer 4a can be distanced away from the conductive adhesive during mounting. Further, an adhered area between the external electrode 4 and the conductive adhesive can be increased. Thereby, the thickness of the internal electrode layer 4b and the thickness of the upper electrode layer 4c around the end of the external electrode extension part can be made thicker, thus deterioration of the strength of the conductive adhesive is suppressed and an adhesive strength can be suppressed from decreasing. That is, the mounting reliability can be improved.

By increasing t2 by thickening the thickness of the intermediate electrode layer 4b and the thickness of the upper electrode layer 4c around the end of the external electrode extension part and also by increasing t1 which is the total thickness of the thickness of the upper electrode layer 4c and the thickness of the intermediate electrode layer 4b of the external electrode maximum thickness part, the mounting reliability can be improved. However, by doing so, the size along Y axis and/or Z axis becomes large. By having 1.20 or more of t2/t1, effects of thickening the thickness of the intermediate electrode layer 4b and the thickness of the upper electrode layer 4c while making the size along Y axis and/or Z axis of the external electrode compact can be obtained. Also, t2/t1 may be 1.30 or more.

Note that, in case t2/t1 is larger than 4.50, among the side faces of the ceramic body 10, a crack trends to easily form to the parts where the external electrode is contacting.

As the ceramic body 10 becomes smaller, a heat impact resistance improves, and the mounting reliability tends to improve, because as the ceramic body 10 becomes smaller, the external electrode 4 is less likely released in response to heat shock. Therefore, there is no particular upper limit and lower limit of t1 and t2. For example, it may be 1.0 µm≤t1≤13.0 µm, or 2.0 µm≤t1≤13.0 µm. Also, t2 may be 1.2 µm≤t2≤58.5 µm or may be 3.0 µm≤t2≤34.7 µm. Note that, when t1 is larger than 13.0 among the side faces of the ceramic body 10, a crack trends to easily form to the parts where the external electrode is contacting.

Also, when t3 is a thickness of the base electrode layer 4a at the external electrode maximum thickness part along Y axis and/or Z axis of the external electrode extension part and t4 is a length from an end (P2) of the base electrode layer 4a to the part where the thickness of the base electrode layer 4a is (0.5×t3) along X axis of the base electrode layer 4a, (0.5×t3)/t4=tan θ is satisfied. That is, θ is an angle between X axis and line P2-P4 of FIG. 2. Here, 3°≤θ≤30° may be satisfied. Particularly, by satisfying θ≤30°, t2/t1≥1.20 tends to be easily satisfied. Note that, θ<3° is technically difficult to attain. Also, same can be said when Z axis is interchanged with Y axis.

Also, when t5 is a thickness of the upper electrode layer 4c at the external electrode maximum thickness part along Y axis and/or Z axis of the external electrode extension part, 0.003≤t5/t1≤0.130 may be satisfied. That is, compared to the intermediate electrode layer 4b, the upper electrode layer 4c is preferably thin. The upper electrode layer includes the element having higher standard electrode potential than Cu, and in many cases the element having higher standard electrode potential than Cu is an expensive element such as Au, Pd, and the like. Therefore, by satisfying t5/t1≤0.130, it is possible to improve the mounting reliability of the ceramic capacitor 1 while reducing the cost. Further, when t5/t1≥0.003 is satisfied, the upper electrode layer 4c attains sufficient thickness, pinhole effect can be prevented. Further, a crack originating from corrosion and the pinhole effect can be suppressed, and the mounting reliability can be improved.

Further, as mentioned in above, the base electrode layer 4a may include glass. When the base electrode layer 4a includes glass, a plurality of glass phases exists at boundary between the base electrode layer 4a and the intermediate electrode layer 4b in the cross section of the external electrode 4a including X axis and Z axis as shown in FIG. 3. Here, as shown in FIG. 3, S represents distance between 31a to 31b where 31a and 31b are intercept points between the glass phase 30 and the boundary. In the plurality of glass phases 30 existing in the boundary between the base electrode layer 4a and the intermediate electrode layer 4b, S is measured. The average of S is represented by $S_{ave}$, and it may satisfy $1.40 \leq t1/S_{ave} \leq 4.00$, and may satisfy $1.80 \leq t1/S_{ave} \leq 3.08$.

By satisfying $t1/S_{ave} \geq 1.40$, a total thickness t1 of the upper electrode layer 4c and the intermediate electrode layer 4b becomes sufficiently thick, and a pinhole can be prevented. Further, a crack originating from corrosion and pinhole can be suppressed, and the mounting reliability can be improved. When $t1/S_{ave} \geq 1.80$ is satisfied, the above-mentioned effects are enhanced. Further, by satisfying $t1/S_{ave} \leq 4.00$, stress can be suppressed from increasing and also the size of the external electrode 4 can be easily made compact. When $t1/S_{ave} \leq 3.08$ is satisfied, the above-mentioned effects are further enhanced. Also, same can be said to the cross section of the external electrode 4a including X axis and Y axis.

When $S_{ave}$ is calculated, S is measured for at least 20 glass phases 30 then the average is taken. A glass phase having less than 1 µm of S is not taken into the calculation. Also, as shown in FIG. 3, the glass phase 30 passing through the straight line n at the boundary between the external electrode end part and the external electrode extension part may be taken into the calculation of $S_{ave}$.

The methods of measuring t1 to t5 and $S_{ave}$ are not particularly limited. For example, the cross section cut at XY plane or XZ plane of the multilayer ceramic capacitor 1 is observed using an optical microscope, SEM, a digital microscope, and the like by appropriately adjusting a magnification, thereby t1 to t5 and $S_{ave}$ may be measured.

The thickness of the base electrode layer 4a, the thickness of the intermediate electrode layer 4b, and the thickness of the upper electrode layer 4c at the external electrode end part are not particularly limited. For example, the thickness of the base electrode layer 4a may be 5.0 to 80.0 µm. The thickness of the intermediate electrode layer 4b may be 1.0 to 12.0 µm. The thickness of the upper electrode layer 4c may be 0.01 to 2.0 µm.

Figure 4:
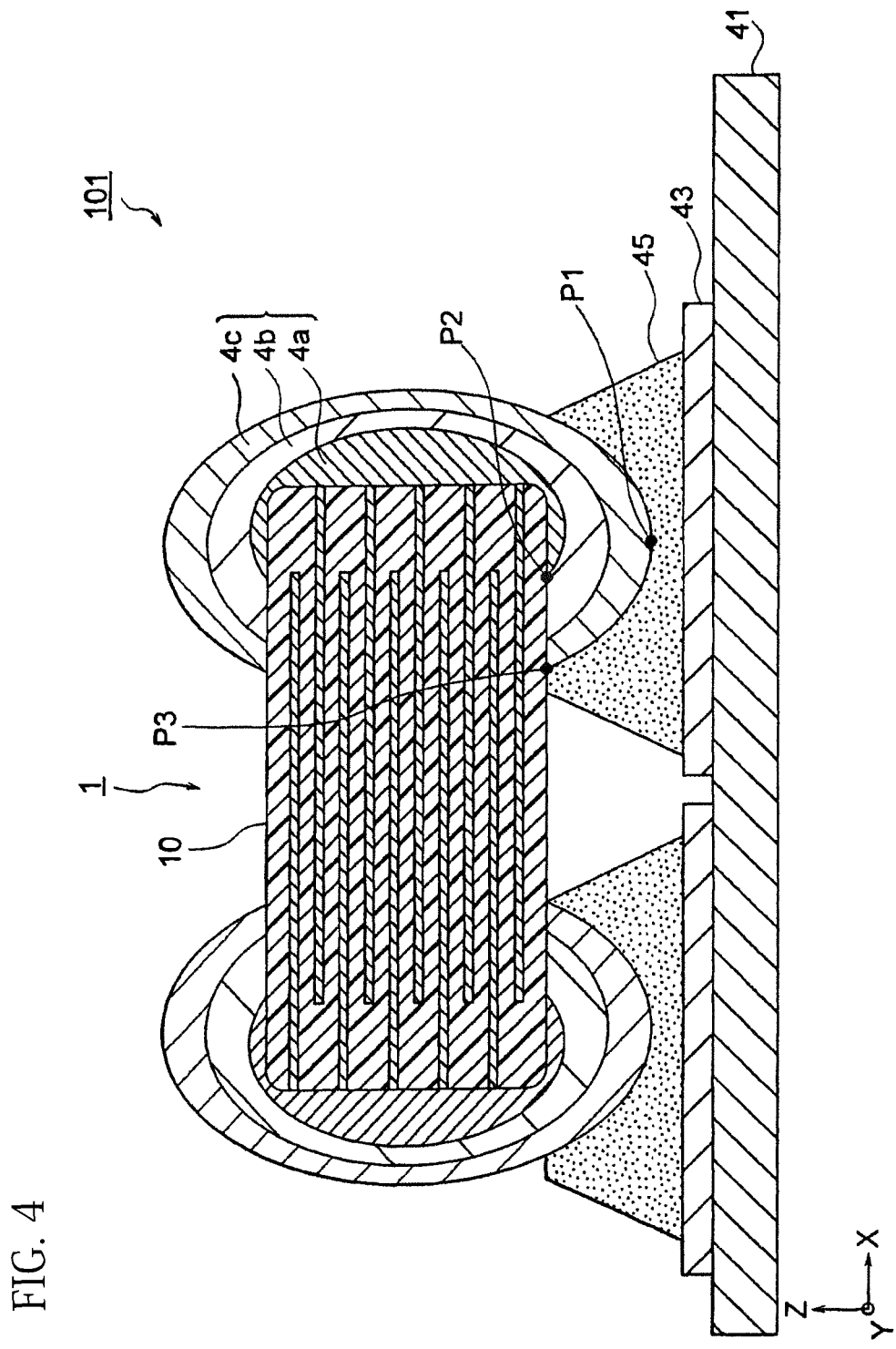
FIG. 4 shows a schematic cross section of a mounting structure of the multilayer ceramic capacitor.

As shown in FIG. 4, a mounting structure 101 of the multilayer ceramic capacitor 1 according to the present embodiment includes the multilayer ceramic capacitor 1 and the mounting substrate 41 to which the multilayer ceramic capacitor 1 is fixed and mounted.

The mounting substrate 41 has a pair of lands 43 capable of electrically connecting to the external electrodes. Further, the pair of lands and the external electrode extension part satisfying the above-mentioned characteristics such as t2/t1 and the like are bonded by a conductive adhesive 45. A bonding method using the conductive adhesive is preferable from the point that it has smaller environmental burden compared to a bonding method using a solder including Pb. The type of the conductive adhesive 45 is not particularly limited. For example, a conductive adhesive added with conductive particles such as a metal filler and the like to a heat curable resin such as an epoxy-based heat curable resin may be used. A known conductive adhesive may be used as well. Note that, a type of the metal filler is not particularly limited. For example, Ag, Au, and the like may be mentioned.

A material and type of the mounting substrate and the pair of the lands 43 are not particularly limited as long as the multilayer ceramic capacitor 1 can be mounted by the conductive adhesive 45. A known mounting substrate having a pair of lands may be used.

As mentioned in above, when t2/t1 is 1.20 or more and 4.50 or less, deterioration of the resin component of the conductive adhesive 45 caused by copper damage becomes difficult to proceed, and the mounting reliability tends to improve.

Next, one example of a production method of the multilayer ceramic capacitor 1 shown in FIG. 1 is explained.

In order to produce the multilayer ceramic capacitor 1 shown in FIG. 1, first, a ceramic green sheet including a ceramic material constituting the ceramic body 10 is prepared.

A type of ceramic material is not particularly limited. For example, the ceramic material including $BaTiO_3$, $CaTiO_3$, $SrTiO_3$, $CaZrO_3$, $BaZrO_3$, $(K_{1-x}Na_x)Sr_2Nb_5O_{15}$, $Ba_3TiNb_4O_{15}$, and the like as the main component can be used. Note that, "include as a main component" means that 70 mass % or more is included relative to 100 mass % of the ceramic material.

Also, the ceramic material may include a sub component other than the above-mentioned main component. A type of the sub component is not particularly limited. For example, Mn compound, Mg compound, Cr compound, Co compound, Ni compound, a compound of rare earth element, Si compound, Li compound, V compound, Ta compound, and the like may be included.

Next, a conductive paste is coated on the ceramic green sheet, and a conductive pattern corresponding to the internal electrode layer 3 is formed. The conductive paste at least includes conductive fine particles. Further, a known binder and/or known solvent may be included appropriately. A material of the conductive fine particles is selected depending on the material of the target internal electrode layers 3. For example, it may be Ni, Ni-based alloy, Cu, or Cu-based alloy. Also, the conductive fine particles may include various trace amount components such as P and the like. A content of the trace amount components such as P and the like may be 0.1 mass % or less relative to 100 mass % of the conductive fine particles. The particle size of the conductive fine particles is not particularly limited. For example, it may be 0.05 to 0.5 μm.

A method of coating the conductive paste is not particularly limited. For example, it may be coated by various printing methods such as a screen printing method and the like.

A plurality of ceramic green sheets with no conductive pattern formed, a ceramic green sheet formed with a conductive pattern, and a plurality of ceramic green sheets with no conductive pattern formed are stacked in this order, thereby a mother multilayer body is produced.

By cutting the mother multilayer body along a hypothetical cut line on the mother multilayer body, a plurality of green ceramic bodies is produced. Note that, a method of cutting the mother multilayer body is not particularly limited. For example, methods such as dicing, pressing and cutting, and the like may be mentioned. Further, by performing barrel polishing to the green ceramic bodies obtained by cutting, edges and corners of the green ceramic bodies may be rounded off.

By firing the green ceramic bodies, the ceramic body 10 is obtained. A temperature during firing is not particularly limited, and it may be suitably selected depending on the ceramic material and the material of the conductive paste. For example, it may 1100° C. to 1400° C.

A terminal paste is applied to each side face 10b of the ceramic body 10 from the both end faces 10a of the fired ceramic body 10. Then, it is dried and baked, thereby the base electrode layer 4a is formed. Also, during the above-mentioned steps, the terminal paste may be wiped by blotting. The material of the terminal paste is suitably selected depending on the material of the target base electrode layer 4a. That is, the terminal paste at least includes Cu. Further, it may include glass frit. A size of the glass frit is not particularly limited, and it may be suitably selected depending on the value of target $S_{ave}$. The terminal paste may further include a known resin and/or a known solvent accordingly. A method of coating the terminal paste is not particularly limited. For example, methods such as a dipping method, a printing method, and the like may be mentioned.

Here, θ can be suitably controlled by using rheology of the terminal paste itself. Also, θ can be controlled by regulating a viscosity of the solvent and the resin included in the terminal paste, a time from coating and drying, and an absorbed amount of the terminal paste by blotting.

A temperature for baking the metal paste is not particularly limited. For example, it may be 700 to 900° C.

Next, the intermediate electrode layer 4b is formed on the base electrode layer 4a. A method of forming the intermediate electrode layer 4b is not particularly limited. For example, methods such as barrel plating, spattering, and the like may be mentioned. When the intermediate electrode layer is formed by barrel plating, barrel plating may be carried out by electrolytic plating or by electroless plating. Also, when the intermediate electrode layer 4b is constituted by two or more layers, the intermediate electrode layer 4b can be formed by repeating twice or more.

Hereinbelow, the method of forming the intermediate electrode layer 4b by barrel plating using electrolytic plating is described.

A metal media and the ceramic body 10 formed with the base electrode layer 4a are filled in a barrel container. Here, a total volume of the ceramic body 10 and the metal media may be 10 to 50% of a capacity of the barrel container. Also, a blending amount of the ceramic body 10 with respect to a total amount of the ceramic body 10 and the metal media may be 5 to 70%. Further, the barrel container may be rotated in a speed of 5 to 20 rpm.

Also, by decreasing θ when the base electrode layer 4a is formed, specifically by controlling θ to be within 3°≤θ≤30°, an electric current during plating tends to concentrate near the end (P2) of the extension part of the base electrode layer 4a. As a result, t2 tends to become longer than t1, and 1.20≤t2/t1≤4.50 tends to be satisfied easily. Further, by regulating a condition of electric current flow, an amount of the buffer (for example boric acid) included in the plating solution, and the like, the electric current during plating tends to easily concentrate near the end of the extension part of the base electrode layer 4a. Specifically, as the amount of the buffer included in the plating solution decreases and the electric current level is high when electric current is flowing, the electric current tends to easily concentrate near the end of the extension part of the base electrode layer 4a.

Next, by forming the upper electrode layer 4c on the intermediate electrode layer 4b, the multilayer ceramic capacitor 1 is formed. A method of forming the upper electrode layer 4c is not particularly limited. For example, methods such as barrel plating, spattering, and the like may be mentioned. When the intermediate electrode layer is formed by barrel plating, barrel plating may be performed by electrolytic plating or electroless plating.

The mounting structure of the multilayer ceramic capacitor 1 shown in FIG. 4 can be produced by a known method using the conductive adhesive.

By satisfying t2/t1 of 1.20 or more at the external electrode extension part bonded by the conductive adhesive, the size along Z axis of FIG. 4 can be made small, while the copper damage occurring between the conductive adhesive and the external electrode 4 can be suppressed. Since the copper damage can be suppressed, the mounting reliability improves.

Hereinabove, the embodiment of the present invention has been described, however the present invention is not limited to the above-mentioned embodiment, and the present invention can be variously modified within the scope of the present invention. For example, an embodiment of mounting the multilayer electronic component according to the present invention to a multilayer substrate by embedding in the multilayer substrate may be mentioned.

EXAMPLES

Hereinafter, the present invention is described in detail using examples of the present invention. However, the present invention is not limited thereto.

As a ceramic body of a multilayer ceramic capacitor, the ceramic body including ceramic layers having $CaZrO_3$ as a main component and internal electrode layers having Ni was prepared. Here, three ceramic bodies with different sizes were prepared. Specifically, the three ceramic bodies of rectangular parallelepiped shape with sizes of (X axis length)×(Y axis length)×(Z axis length) of 1.6 mm×0.8 mm×0.8 mm, 0.6 mm×0.3 mm×0.3 mm, and 3.2 mm×1.6 mm×1.6 mm were prepared. A size of chip of capacitor samples shown in Table 1 and Table 3 were 1.6 mm×0.8 mm×0.8 mm. In Table 2, the size of chip of the capacitor samples are indicated.

A metal paste including Cu and glass frit was coated to part of all side faces of the ceramic body from end faces of the fired ceramic body. The metal paste was coated by dipping. The metal paste was dried and baked, thereby a base electrode layer was formed. The metal paste was baked at a temperature of 700° C. to 900° C. A size of glass frit included in the metal paste was regulated so that $S_{ave}$ of samples shown in Table 1 and Table 3 were 3.0 μm. For the samples shown in Table 2, the glass frit size was regulated so that $S_{ave}$ was the value shown in Table 2.

In each sample, t3, t4, and θ were controlled by using rheology of the terminal paste itself. Specifically, it was controlled by viscosity of the metal paste, a time from dipping to drying, and absorbance of the base electrode layer by blotting. The viscosity of the metal paste is controlled by regulating a content and a type of the solvent and the resin included in the metal paste.

Next, for samples except for Sample No. 10b and 10c, a Ni plating layer as an intermediate electrode layer was formed by barrel plating using a watt solution including boric acid as a buffer. Note that, media size φ was 1.0 mm.

By controlling a length of time and a value of electric current of barrel plating when the intermediate electrode layer was formed, t2/t1 was controlled to satisfy values shown in Tables 1 to 3. For example, electric current of Sample No. 5 of Table 1 was 1.8 times of Sample No. 3 of Table 1, and a length of time of plating of Sample No. 5 of Table 1 was 0.5 times of Sample No. 3 of Table 1. Also, electric current of Sample No. 6 of Table 1 was 1.8 times of Sample No. 7 of Table 1, and a length of time of plating of Sample No. 6 of Table 1 was 0.5 times of Sample 7 of Table 1.

For Sample No. 10, 11, and 12, a Pd plating layer was formed as the intermediate electrode layer on the above-mentioned Ni plating layer by barrel plating using a Pd solution for electrolytic plating. Note that, in Sample No. 10 to 12, a thickness of the Ni plating layer of the maximum thickness part was 7.5 μm and a thickness of the Pd plating layer at the maximum thickness part was 0.15 μm. Note that, a media size φ was 1.0 mm and a plating time was 10 to 20 minutes.

In Sample No. 10a, a Pt plating layer was formed as the intermediate electrode layer on the above-mentioned Ni plating layer by electrolytic plating. In Sample. 10a, a thickness of the Ni plating layer at the maximum thickness part was 7.5 μm and a thickness of the Pt plating layer at the maximum thickness part of 0.15 μm. Note that, a media size φ was 1.0 mm and a plating time was 10 to 20 minutes.

In Sample No. 10b, a Pd plating layer was formed as the intermediate electrode layer on the base electrode layer, and then a Ni plating layer was formed as the intermediate electrode layer on the Pd plating layer. In Sample No. 10c, a Pt plating layer was formed as the intermediate electrode layer on the base electrode layer, and then a Ni plating layer was formed as the intermediate electrode layer on the Pt plating layer. A thickness of the Pd plating layer and a thickness of the Pt electrode layer at the maximum thickness part were 0.15 μm, and a thickness of the Ni plating layer at the maximum thickness part was 7.5 μm. A media size was same as the media size during Ni plating, Pd plating, and Pt plating of other examples.

Next, in Sample No. 1 to 12 and 20 to 34, an Au plating layer was formed as the upper electrode layer by electrolytic plating. In Sample No. 13 to 19, a Pd plating layer was formed as the upper electrode layer by barrel plating using a Pd solution for electrolytic plating. In Sample No. 41, an Au—Pd—Ni alloy plating layer was formed as the upper electrode layer using electrolytic plating. In Sample No. 42, an Au—Pd alloy plating layer was formed by electrolytic plating. In Sample No. 43, a Pt plating layer was formed as the upper electrode layer by electrolytic plating. In Sample No. 44, a Sn plating layer was formed as the upper electrode layer by electrolytic plating. Also, t5 was regulated to satisfy the value shown in Table 1 to Table 3. A media size φ was 1.0 mm and a plating time was 8 to 25 minutes.

Next, each capacitor sample was fixed and mounted on the mounting substrate. The mounting substrate was made of alumina, and had a pair of lands including Cu. Specifically, the external electrode extension part and the pair of lands of each capacitor sample were bonded using the conductive adhesive. As the conductive adhesive, an epoxy based silver conductive adhesive was used. The conductive adhesive was coated on the pair of lands, and the external electrode extension part was placed on the conductive adhesive, then heated at 150° C. for 60 minutes. Thereby, each capacitor sample was fixed and mounted.

Methods of measuring t1 to t5, θ, and $S_{ave}$ according to the present examples are described in below. Each capacitor sample of Table 1 to Table 3 was polished along Y axis of FIG. 1 to FIG. 4 and parallel to Z-X plane until the polished surface reached to a center part along Y axis of the capacitor sample.

Next, among the external electrode extension parts of the external electrode at one side of the cross section, the external electrode extension part at the mounting side was observed using a digital microscope (magnification of 2000×) and SEM (magnification of 5000×), and t1 to t5, θ, and $S_{ave}$ were calculated. Table 1 and Table 3 show t1 to t5, θ, and $S_{ave}$ of each sample. Note that, regarding $S_{ave}$, among glass phases included in the external electrode extension part at boundary between the base electrode layer and the intermediate electrode layer, the glass phases having a length of less than 1 μm in the boundary were excluded. Then, the length of at least 20 glass phases in the boundary were measured, and an average was calculated.

<Crack Malfunction>

Presence of a crack was observed using the above-mentioned optical microscope. Table 1 to Table 3 shows a number of capacitor samples having a crack out of 20 capacitor samples. Note that, when a ratio of the capacitor sample with a crack was 0 out of 20, then it was considered good.

<Rate of Increase of (t1+t3)>

The thickness of the external electrode maximum thickness part is represented by (t1+t3). Here, regarding Sample No. 1 to 26 having the chip size of 1.6 mm×0.8 mm×0.8 mm, Table 1 and Table 2 show the rate of increase of (t1+t3) when (t1+t3) of Sample No. 7 was taken as a standard. The rate of increase of (t1+t3) of less than 5.0% was considered good. When the rate of increase of (t1+t3) was 5.0% or more, the external electrode becomes too thick and causes difficulty to attain compact capacitor.

<Heat Shock Cycle Test>

Heat shock cycle test was performed while 20 capacitor samples were fixed and mounted on the mounting substrate. An air tank was maintained at −55° C. for 30 minutes and then was maintained at 150° C. for 30 minutes. This was repeated for 2000 cycles, and then voltage of 50 V at 85° C., 85% RH was applied for 200 hours. Note that, when 1 or more capacitor samples with a crack was found among 20 capacitor samples, then the heat shock cycle test was not performed.

After performing the heat shock test, the capacitor sample was polished perpendicularly to the substrate mounting face and along Y axis of the capacitor sample and parallel to Z-X plane until the polished surface reached a center part along Y axis of the capacitor sample. Further, the polished surface was observed to verify whether there was any release between the conductive adhesive and the external electrode (upper electrode layer), and the ratio of the capacitor sample having release was calculated. Note that, the observation was carried out using a metallographic microscope under magnification of 100 to 500×. The results are shown in Table 1 to Table 3. When the ratio of the capacitor sample having release was 20% or less, it was considered good, and 0% was considered even better. Note that, when the result of the heat shock test was good, then the mounting reliability was good.

TABLE 1

| Sample No. | Base electrode layer t3 μm | Base electrode layer t4 μm | Base electrode layer θ ° | Intermediate electrode layer Type of material | Upper electrode layer Type of material | Upper electrode layer t5 μm | Intermediate electrode layer + Upper electrode layer t1 μm | Intermediate electrode layer + Upper electrode layer t2 μm | Intermediate electrode layer + Upper electrode layer t2/t1 | Intermediate electrode layer + Upper electrode layer t5/t1 | Intermediate electrode layer + Upper electrode layer t1/$S_{ave}$ | t1 + t3 μm | Rate of increase of (t1 + t3) % | Cross section obsevation before mounting Number of capacitors with cracks Number | Observation external electrode after rheat shock cycle test Ratio of release % |
|---|---|---|---|---|---|---|---|---|---|---|---|---|---|---|---|
| 1 | 15.0 | 13.0 | 30 | Ni | Au | 0.20 | 7.7 | 9.3 | 1.20 | 0.026 | 2.57 | 22.7 | 0.0% | 0 | 10% |
| 2a | 15.0 | 21.0 | 20 | Ni | Au | 0.20 | 7.7 | 10.0 | 1.30 | 0.026 | 2.57 | 22.7 | 0.0% | 0 | 0% |
| 2 | 15.0 | 21.0 | 20 | Ni | Au | 0.20 | 7.7 | 10.2 | 1.32 | 0.026 | 2.57 | 22.7 | 0.0% | 0 | 0% |
| 3 | 15.0 | 61.0 | 7 | Ni | Au | 0.20 | 7.7 | 23.5 | 3.05 | 0.026 | 2.57 | 22.7 | 0.0% | 0 | 0% |
| 4 | 15.0 | 145.0 | 3 | Ni | Au | 0.20 | 7.7 | 34.3 | 4.45 | 0.026 | 2.57 | 22.7 | 0.0% | 0 | 0% |
| 5 | 15.0 | 61.0 | 7 | Ni | Au | 0.20 | 7.7 | 34.7 | 4.50 | 0.026 | 2.57 | 22.7 | 0.0% | 0 | 0% |
| 5a* | 15.0 | 61.0 | 7 | Ni | Au | 0.20 | 7.7 | 37.0 | 4.81 | 0.026 | 2.57 | 22.7 | 0.0% | 2 | — |
| 6 | 15.0 | 8.0 | 43 | Ni | Au | 0.20 | 7.7 | 12.6 | 1.63 | 0.026 | 2.57 | 22.7 | 0.0% | 0 | 0% |
| 7* | 15.0 | 8.0 | 43 | Ni | Au | 0.20 | 7.7 | 8.5 | 1.10 | 0.026 | 2.57 | 22.7 | 0.0% | 0 | 40% |
| 8* | 15.0 | 4.0 | 62 | Ni | Au | 0.20 | 9.3 | 9.3 | 1.00 | 0.022 | 3.10 | 24.3 | 7.0% | 0 | 0% |
| 9* | 15.0 | 4.0 | 62 | Ni | Au | 0.20 | 14.2 | 14.2 | 1.00 | 0.014 | 4.73 | 29.2 | 28.6% | 2 | — |
| 10 | 15.0 | 21.0 | 20 | Ni/Pd | Au | 0.05 | 7.7 | 9.8 | 1.27 | 0.006 | 2.57 | 22.7 | 0.0% | 0 | 0% |
| 10a | 15.0 | 21.0 | 20 | Ni/Pt | Au | 0.05 | 7.7 | 9.8 | 1.27 | 0.006 | 2.57 | 22.7 | 0.0% | 0 | 0% |
| 10b | 15.0 | 21.0 | 20 | Pd/Ni | Au | 0.05 | 7.7 | 9.8 | 1.27 | 0.006 | 2.57 | 22.7 | 0.0% | 0 | 0% |
| 10c | 15.0 | 21.0 | 20 | Pt/Ni | Au | 0.05 | 7.7 | 9.8 | 1.27 | 0.006 | 2.57 | 22.7 | 0.0% | 0 | 0% |
| 11 | 15.0 | 61.0 | 7 | Ni/Pd | Au | 0.05 | 7.7 | 22.6 | 2.94 | 0.006 | 2.57 | 22.7 | 0.0% | 0 | 0% |
| 12* | 15.0 | 8.0 | 43 | Ni/Pd | Au | 0.05 | 7.7 | 8.5 | 1.10 | 0.006 | 2.57 | 22.7 | 0.0% | 0 | 40% |
| 13 | 15.0 | 13.0 | 30 | Ni | Pd | 0.20 | 7.7 | 9.3 | 1.20 | 0.026 | 2.57 | 22.7 | 0.0% | 0 | 15% |
| 14 | 15.0 | 21.0 | 20 | Ni | Pd | 0.20 | 7.7 | 10.0 | 1.30 | 0.026 | 2.57 | 22.7 | 0.0% | 0 | 5% |
| 15 | 15.0 | 61.0 | 7 | Ni | Pd | 0.20 | 7.7 | 23.2 | 3.02 | 0.026 | 2.57 | 22.7 | 0.0% | 0 | 0% |
| 16 | 15.0 | 145.0 | 3 | Ni | Pd | 0.20 | 7.7 | 34.1 | 4.42 | 0.026 | 2.57 | 22.7 | 0.0% | 0 | 0% |
| 17* | 15.0 | 8.0 | 43 | Ni | Pd | 0.20 | 7.7 | 8.5 | 1.10 | 0.026 | 2.57 | 22.7 | 0.0% | 0 | 45% |
| 18* | 15.0 | 4.0 | 62 | Ni | Pd | 0.20 | 9.3 | 9.3 | 1.00 | 0.022 | 3.10 | 24.3 | 7.0% | 0 | 0% |
| 19* | 15.0 | 4.0 | 62 | Ni | Pd | 0.20 | 15.2 | 15.2 | 1.00 | 0.013 | 5.07 | 30.2 | 33.0% | 4 | — |

* shows comparative examples

TABLE 2

| Sample No. | Chip size mm | $S_{ave}$ μm | Base electrode layer t3 μm | Base electrode layer t4 μm | Base electrode layer θ ° | Upper electrode layer t5 μm | Intermediate electrode layer + Upper electrode layer t1 μm | Intermediate electrode layer + Upper electrode layer t2 μm | Intermediate electrode layer + Upper electrode layer t2/t1 | Intermediate electrode layer + Upper electrode layer t5/t1 | Intermediate electrode layer + Upper electrode layer t1/$S_{ave}$ | t1 + t3 μm | Rate of increase of (t1 + t3) % | Cross section obsevation before mounting Number of capacitors with cracks Number | Observation external electrode after heat shock cycle test Ratio of release % |
|---|---|---|---|---|---|---|---|---|---|---|---|---|---|---|---|
| 20a | 1.6 × 0.8 × 0.8 | 3.0 | 15.0 | 61.0 | 7 | 1.20 | 7.7 | 21.9 | 2.85 | 0.156 | 2.56 | 22.7 | 0.0% | 0 | 0% |
| 20 | 1.6 × 0.8 × 0.8 | 3.0 | 15.0 | 61.0 | 7 | 1.00 | 7.7 | 21.9 | 2.85 | 0.130 | 1.56 | 22.7 | 0.0% | 0 | 0% |
| 21 | 1.6 × 0.8 × 0.8 | 3.0 | 15.0 | 61.0 | 7 | 0.02 | 7.7 | 23.9 | 3.09 | 0.003 | 2.57 | 22.7 | 0.1% | 0 | 0% |
| 22 | 1.6 × 0.8 × 0.8 | 3.0 | 15.0 | 61.0 | 7 | 0.01 | 7.7 | 23.9 | 3.10 | 0.001 | 2.57 | 22.7 | 0.0% | 0 | 15% |
| 23a | 1.6 × 0.8 × 0.8 | 1.5 | 15.0 | 32.0 | 13 | 0.20 | 7.7 | 15.2 | 1.98 | 0.026 | 5.13 | 22.7 | 0.0% | 0 | 5% |
| 23 | 1.6 × 0.8 × 0.8 | 1.9 | 15.0 | 32.0 | 13 | 0.20 | 7.7 | 15.2 | 1.98 | 0.026 | 4.00 | 22.7 | 0.0% | 0 | 0% |

TABLE 2-continued

| Sample No. | Chip size mm | Base electrode layer | | | | Upper electrode layer | Intermediate electrode layer + Upper electrode layer | | | | | | Rate of increase of (t1 + t3) % | Cross section observation before mounting Number of capacitors with cracks Number | Observation external electrode after heat shock cycle test Ratio of release % |
|---|---|---|---|---|---|---|---|---|---|---|---|---|---|---|---|
| | | $S_{ave}$ μm | t3 μm | t4 μm | θ ° | t5 μm | t1 μm | t2 μm | t2/t1 | t5/t1 | $t1/S_{ave}$ | t1 + t3 μm | | | |
| 24 | 1.6 × 0.8 × 0.8 | 2.5 | 15.0 | 32.0 | 13 | 0.20 | 7.7 | 15.2 | 1.98 | 0.026 | 3.08 | 22.7 | 0.0% | 0 | 0% |
| 25a | 1.6 × 0.8 × 0.8 | 4.3 | 15.0 | 32.0 | 13 | 0.20 | 7.7 | 15.2 | 1.98 | 0.026 | 1.80 | 22.7 | 0.0% | 0 | 0% |
| 25 | 1.6 × 0.8 × 0.8 | 5.5 | 15.0 | 32.0 | 13 | 0.20 | 7.7 | 15.2 | 1.98 | 0.026 | 1.40 | 22.7 | 0.0% | 0 | 0% |
| 26 | 1.6 × 0.8 × 0.8 | 6.0 | 15.0 | 32.0 | 13 | 0.20 | 7.7 | 15.2 | 1.98 | 0.026 | 1.25 | 22.7 | 0.0% | 0 | 10% |
| 27 | 0.6 × 0.3 × 0.3 | 1.8 | 6.0 | 12.0 | 14 | 0.20 | 2.0 | 3.0 | 1.51 | 0.100 | 1.11 | 8.0 | — | 0 | 20% |
| 28 | 0.6 × 0.3 × 0.3 | 1.8 | 6.0 | 12.0 | 14 | 0.20 | 2.5 | 3.8 | 1.51 | 0.079 | 1.40 | 8.5 | — | 0 | 0% |
| 29 | 0.6 × 0.3 × 0.3 | 1.8 | 6.0 | 12.0 | 14 | 0.20 | 4.2 | 6.4 | 1.53 | 0.048 | 2.33 | 10.2 | — | 0 | 0% |
| 30 | 0.6 × 0.3 × 0.3 | 1.8 | 6.0 | 12.0 | 14 | 0.20 | 7.2 | 11.1 | 1.54 | 0.028 | 4.00 | 13.2 | — | 0 | 0% |
| 31 | 3.2 × 1.6 × 1.6 | 4.0 | 20.0 | 35.0 | 16 | 0.20 | 4.7 | 9.2 | 1.96 | 0.043 | 1.18 | 24.7 | — | 0 | 10% |
| 32 | 3.2 × 1.6 × 1.6 | 4.0 | 20.0 | 35.0 | 16 | 0.20 | 6.2 | 12.2 | 1.97 | 0.032 | 1.55 | 26.2 | — | 0 | 0% |
| 33 | 3.2 × 1.6 × 1.6 | 4.0 | 20.0 | 35.0 | 16 | 0.20 | 9.2 | 18.2 | 1.98 | 0.022 | 2.30 | 29.2 | — | 0 | 0% |
| 34 | 3.2 × 1.6 × 1.6 | 4.0 | 20.0 | 35.0 | 16 | 0.20 | 13.0 | 25.8 | 1.99 | 0.015 | 3.25 | 33.0 | — | 0 | 0% |

| Sample No. | Base electrode layer | | | Intermediate electrode layer Type of material | Upper electrode layer Type of material | Intermediate electrode layer + Upper electrode layer | | | | | | Rate of increase of (t1 + t3) % | Cross section observation before mounting Number of capacitors with cracks Number | Observation external electrode after heat shock cycle test Ratio of release % |
|---|---|---|---|---|---|---|---|---|---|---|---|---|---|---|
| | t3 μm | t4 μm | θ ° | | | t5 μm | t1 μm | t2 μm | t2/t1 | t5/t1 | $t1/S_{ave}$ | t1 + t3 μm | | | |
| 2a | 15.0 | 21.0 | 20 | Ni | Au | 0.20 | 7.7 | 10.0 | 1.30 | 0.026 | 2.57 | 22.7 | 0.0% | 0 | 0% |
| 14 | 15.0 | 21.0 | 20 | Ni | Pd | 0.20 | 7.7 | 10.0 | 1.30 | 0.026 | 2.57 | 22.7 | 0.0% | 0 | 5% |
| 41 | 15.0 | 21.0 | 20 | Ni | Au—Pd—Ni | 0.20 | 7.7 | 10.0 | 1.30 | 0.026 | 2.57 | 22.7 | 0.0% | 0 | 0% |
| 42 | 15.0 | 21.0 | 20 | Ni | Au—Pd | 0.20 | 7.7 | 10.0 | 1.30 | 0.026 | 2.57 | 22.7 | 0.0% | 0 | 0% |
| 43 | 15.0 | 21.0 | 20 | Ni | Pt | 0.20 | 7.7 | 10.0 | 1.30 | 0.026 | 2.57 | 22.7 | 0.0% | 0 | 0% |
| 44* | 15.0 | 21.0 | 20 | Ni | Sn | 0.20 | 7.7 | 10.0 | 1.30 | 0.026 | 2.57 | 22.7 | 0.0% | 0 | 50% |

* shows comparative examples

Sample No. 2a, 1 to 4, and 7 were examples and comparative examples in which t2/t1, t4, and θ were varied while maintaining t3 at 15.0 μm, mainly by changing a drying condition of the terminal paste and viscosity of the terminal paste. Note that, it was difficult to have θ of less than 3°. In Sample No. 2a and 1 to 4 in which each parameter was varied within a predetermined range, a crack did not form to the capacitor sample before mounting and also showed a good result of heat shock cycle test. On the contrary to this, Sample No. 7 in which t2/t1 was too small, the result of the heat shock cycle test was not good.

Sample No. 5 and 5a of Table 1 were examples in which t2 was varied by changing the plating condition of the intermediate layer of Sample No. 3. In Sample No. 5 in which each parameter was varied within a predetermined range, a crack did not form to the capacitor sample before mounting and also showed a good result of heat shock cycle test. On the contrary to this, Sample No. 5a in which t2/t1 was too large, the result of the heat shock cycle test was not good.

Sample No. 6 of Table 1 was an example in which t2 was varied by changing the plating condition of the intermediate layer of Sample No. 7. Sample No. 6 having parameters such as t2/t1 and the like within the predetermined range did not have a crack to the capacitor sample before mounting and the result of the heat shock cycle test was good.

Sample No. 8 and 9 of Table 1 were comparative examples of which t1 and t2 were further enlarged, t4 was made smaller, and θ was enlarged compared to Sample No. 7 mainly by changing a drying condition of the terminal paste and viscosity of the terminal paste. In Sample No. 8, since t1 was enlarged and the intermediate electrode layer and the upper electrode layer were thick, a crack did not form to the capacitor sample before mounting and also showed a good result of heat shock cycle test. However, (t1+t3) was too large and caused difficulty to attain a compact capacitor. In Sample No. 9, t1 was even thicker and the intermediate electrode layer and the upper electrode layer were also thicker, thus the capacitor sample had cracks.

Sample No. 10, 11, and 12 of Table 1 were examples and comparative examples of which the intermediate electrode layer was constituted by two layer structure of a Ni plating layer and a Pd plating layer, and an Au plating layer as the upper electrode layer was made thinner as much as the thickness of the Pd plating layer. Sample No. 10 and 11 of which each parameter was varied within a predetermined range did not have a crack to the capacitor sample before mounting and the result of the heat shock cycle test was good. On the contrary to this, Sample No. 12 of which t2/t1 was too small did not show a good result of the heat shock cycle test.

Sample No. 10a of Table 1 was an example of which the Pd plating layer of Sample No. 10 was changed to a Pt plating layer. Sample No. 10b of Table 1 was an example of which the order of stacking of the Pd plating layer and the Ni plating layer of Sample No. 10 was switched. Sample No. 10c was an example of which the order of stacking of the Pt plating layer and the Ni plating layer of Sample No. 10a was switched. In each example, a crack did not form to the capacitor sample before mounting and showed a good result of heat shock cycle test.

Sample No. 13 to 19 of Table 1 were examples and comparative examples of which the upper electrode layer of Sample No. 1 to 4 and 7 to 9 shown in Table 1 was changed to a Pd plating layer. Sample No. 13 to 16 of which the upper electrode layer of Sample No. 1 to 4 of Table 1 was changed, good results were obtained as same as Sample No. 1 to 4. Sample No. 17 to 19 of which the upper electrode layer of Sample No. 7 to 9 of Table 1 was changed to the Pd plating layer had good results as same as Sample No. 7 to 9. Note that, when the examples having the Au plating layer as the upper electrode layer and the examples having Pd plating layer as the upper electrode layer were compared, the result of the heat shock cycle test was better when the upper electrode layer was the Au plating layer.

Sample No. 20a and 20 to 22 of Table 2 were examples of which the thickness of the Au plating layer as the upper electrode layer was changed from the thickness of Sample No. 3 shown in Table 1. Sample No. 20a and 20 to 22 of which the thickness of the Au plating layer was changed but each parameter was changed within a predetermined range did not have a crack to the capacitor sample before mounting and the result of the heat shock cycle test was good. Note that, Sample No. 22 had pinhole caused by the heat shock cycle test since the upper electrode layer was thin, and a crack originating from corrosion and pinhole was observed.

Sample No. 23a, 25a, and 23 to 26 of Table 2 were examples of which
$S_{ave}$ was varied by changing the size of glass frit. Sample No. 25a and 23 to 25 satisfying $1.40 \leq t1/S_{ave} \leq 4.00$ had a good result of heat shock cycle test compared to Sample No. 23a having $t1/S_{ave} > 4.00$ and Sample No. 26 having $t1/S_{ave} < 1.40$. Sample No. 23a had large t1 with respect to the size of glass phase, thus stress increased and the result of the heat shock cycle test was not as good as Sample No. 25a and 23 to 25. Sample No. 26 had small t1 with respect to the size of glass phase, thus pinhole was formed due to the heat shock cycle test and a crack originating from corrosion and pinhole was observed.

Sample No. 27 to 30 of Table 2 were examples of which t1 and t2 were changed by having a chip size of 0.6 mm×0.3 mm×0.3 mm and changing the length of time for Ni plating. Sample No. 28 to 30 satisfying $1.40 \leq t1/S_{ave} \leq 4.00$ had a good result of heat shock cycle test compared to Sample No. 27 having $t1/S_{ave} < 1.40$. Sample No. 27 had small t1 with respect to the size of the glass phase, thus pinhole was formed due to the heat shock cycle test and a crack originating from corrosion and pinhole was observed.

Sample No. 31 to 34 of Table 2 were examples of which t1 and t2 were varied by having a chip size of 3.2 mm×1.6 mm×1.6 mm and changing the length of time for Ni plating. Sample No. 32 to 34 satisfying $1.40 \leq t1/S_{ave} \leq 4.00$ had a good result of heat shock cycle test compared to Sample No. 31 having $t1/S_{ave} < 1.40$. Sample No. 31 had small t1 with respect to the size of the glass phase, thus pinhole was formed due to the heat shock cycle test and a crack originating from corrosion and pinhole was observed.

Sample No. 41 to 44 of Table 3 were examples and comparative examples of which a type of the upper electrode layer of Sample No. 2a was changed. Sample No. 41 to 43 of which the upper electrode layer included an element having higher standard electrode potential than Cu did not have a crack to the capacitor sample before mounting and showed good results of the heat shock cycle test. On the contrary to this, Sample No. 44 of which the upper electrode layer did not include an element having higher standard electrode potential than Cu tended to easily have galvanic corrosion and a rate of releasing after the heat shock cycle test was deteriorated.

NUMERICAL REFERENCES

1 . . . Multilayer ceramic capacitor
2 . . . Ceramic layer
3 . . . Internal electrode layer
4 . . . External electrode layer
4a . . . Base electrode layer
4b . . . Intermediate electrode layer
4c . . . Upper electrode layer
10 . . . Ceramic body
10a . . . End face (of ceramic body)
10b . . . Side face (of ceramic body)
30 . . . Glass phase
31a, 31b . . . Intercept point between boundary and glass phase
41 . . . Mounting substrate
43 . . . Land
45 . . . Conductive adhesive
101 . . . Multilayer structure of multilayer ceramic capacitor

What is claimed is:

1. A multilayer electronic component comprising
a ceramic body in which internal electrode layers and ceramic layers substantially parallel to a plane including a first axis and a second axis are stacked in alternating manner along a third axis, and
an external electrode formed on an end face of the first axis of the ceramic body; wherein
the external electrode comprises
a base electrode layer formed directly on the end face of the ceramic body so to electrically connect with at least part of the internal electrode layers,
an intermediate electrode layer formed on an outer surface of the base electrode layer, and
an upper electrode layer formed on an outer surface of the intermediate electrode layer;
the base electrode layer includes Cu;
the intermediate electrode layer includes Ni;
the upper electrode layer includes an element having higher standard electrode potential than Cu;
the external electrode includes
an external electrode end part covering the end face of the ceramic body in the first axis and
an external electrode extension part integrally formed with the external electrode end part and covering side faces of the ceramic body facing across the second axis and also covering side faces of the ceramic body facing across the third axis; and $1.20 \leq t2/t1 \leq 4.50$ is satisfied in which t1 is a total thickness of a thickness of the intermediate electrode layer and a thickness of the upper electrode layer at an external electrode maximum thickness part having a maximum thickness of the external electrode in the external electrode extension part and t2 is a length from an end of the base electrode layer to an end of the upper electrode layer along the first axis of the external electrode extension part.

2. The multilayer electronic component according to claim 1, wherein 3°≤θ≤30° is satisfied when (0.5×t3)/t4=tan θ in which t3 is a thickness of the base electrode layer in the external electrode maximum thickness part and t4 is a length from an end of the base electrode layer to a part where the thickness of the base electrode layer is 0.5×t3 along the first axis of the base electrode layer.

3. The multilayer electronic component according to claim 1, wherein 0.003≤t5/t1≤0.130 is satisfied in which t5 is a thickness of the upper electrode layer of the external electrode maximum thickness part.

4. The multilayer electronic component according to claim 1, wherein glass phases exist in the external electrode extension part at a cross section of the external electrode including the first axis and the third axis, and 1.40≤t1/$S_{ave}$≤4.00 is satisfied in which $S_{ave}$ is an average length of the glass phases included in the external electrode extension part at a boundary between the base electrode layer and the intermediate electrode layer.

5. The multilayer electronic component according to claim 1, wherein the upper electrode layer includes one or more elements selected from Au and Pd as the element having a higher standard electrode potential than Cu.

6. A mounting structure of a multilayer electronic component comprising the multilayer electronic component and a mounting substrate to which the multilayer electronic component is fixed; wherein
the multilayer electronic component comprises
a ceramic body in which internal electrode layers and ceramic layers substantially parallel to a plane including a first axis and a second axis are stacked in alternating manner along a third axis, and
an external electrode formed on an end face of the first axis of the ceramic body;
the external electrode comprises
a base electrode layer formed directly on the end face of the ceramic body so to electrically connect with at least part of the internal electrode,
an intermediate electrode layer formed on an outer surface of the base electrode layer, and
an upper electrode layer formed on an outer surface of the intermediate electrode layer;
the base electrode layer includes Cu;
the intermediate electrode layer includes Ni;
the upper electrode layer includes an element having higher standard electrode potential than Cu;
the external electrode includes
an external electrode end part covering the end face of the ceramic body in the first axis and
an external electrode extension part integrally formed with the external electrode part and covering side faces of the ceramic body facing across the second axis and also covering side faces of the ceramic body facing across the third axis;
the mounting substrate includes a land as a part of a pair of lands which is capable of electrically connecting to the external electrode;
the external electrode extension part and the land are bonded using a conductive adhesive; and $1.20 \leq t2/t1 \leq 4.50$ is satisfied in which t1 is a total thickness of a thickness of the intermediate electrode layer thickness and a thickness of the upper electrode layer at an external electrode maximum thickness part having a maximum thickness of the external electrode in the external electrode extension part and t2 is a length from an end of the base electrode layer to an end of the upper electrode layer along the first axis of the external electrode extension part connected by the conductive adhesive.

7. The mounting structure of a multilayer electronic component according to claim 6, wherein 3°≤θ≤30° is satisfied when (0.5×t3)/t4=tan θ in which t3 is a thickness of the base electrode layer in the external electrode maximum thickness part and t4 is a length from an end of the base electrode layer to a part where the thickness of the base electrode layer is 0.5×t3 along the first axis of the base electrode layer.

8. The mounting structure of a multilayer electronic component according to claim 6, wherein 0.003≤t5/t1≤0.130 is satisfied in which t5 is a thickness of the upper electrode layer of the external electrode maximum thickness part.

9. The mounting structure of a multilayer electronic component according to claim 6, wherein glass phases exist in the external electrode extension part at a cross section of the external electrode including the first axis and the third axis, and 1.40≤t1/$S_{ave}$≤4.00 is satisfied in which $S_{ave}$ is an average length of the glass phases included in the external electrode extension part at a boundary between the base electrode layer and the intermediate electrode layer.

10. The mounting structure of a multilayer electronic component according to claim 6, wherein the upper electrode layer includes one or more elements selected from Au and Pd as the element having a higher standard electrode potential than Cu.

* * * * *